US012282443B2

(12) United States Patent
Kiener et al.

(10) Patent No.: US 12,282,443 B2
(45) Date of Patent: *Apr. 22, 2025

(54) RACK CONTROLLER WITH NATIVE SUPPORT FOR INTELLIGENT PATCHING EQUIPMENT INSTALLED IN MULTIPLE RACKS

(71) Applicant: CommScope Technologies LLC, Hickory, NC (US)

(72) Inventors: Matthew R. Kiener, Richardson, TX (US); Ryan E. Enge, Carrollton, TX (US); Patrick Lee Fariello, Murphy, TX (US); Dallas Bartlett, Plano, TX (US); Thomas Eastham, Prestatyn (GB); Lary Blake Van Scoy, Allen, TX (US); Philip Smith, Great Barrow (GB)

(73) Assignee: CommScope Technologies LLC, Claremont, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/147,516

(22) Filed: Dec. 28, 2022

(65) Prior Publication Data

US 2023/0140676 A1 May 4, 2023

Related U.S. Application Data

(62) Division of application No. 16/619,076, filed as application No. PCT/US2018/036137 on Jun. 5, 2018, now Pat. No. 11,567,891.

(Continued)

(51) Int. Cl.
*G06F 13/36* (2006.01)
*G06F 13/40* (2006.01)
*H05K 5/00* (2006.01)

(52) U.S. Cl.
CPC ....... *G06F 13/4027* (2013.01); *H05K 5/0017* (2013.01)

(58) Field of Classification Search
None
See application file for complete search history.

(56) References Cited

U.S. PATENT DOCUMENTS 6,522,737 B1 * 2/2003 Bartolutti .............. H04Q 1/136
379/27.01
6,688,910 B1 2/2004 Macauley
(Continued)

FOREIGN PATENT DOCUMENTS

CN 1953404 A 4/2007
CN 102239702 A 11/2011
(Continued)

OTHER PUBLICATIONS

Australian Government IP Australia, "Examination report No. 1 for standard patent application", from AU Application No. 2018281335, from Foreign Counterpart to U.S. Appl. No. 16/619,076, May 9, 2022, pp. 1 through 3, Published: AU.

(Continued)

*Primary Examiner* — Henry Tsai
*Assistant Examiner* — Dean Phan
(74) *Attorney, Agent, or Firm* — Fogg & Powers LLC (57) ABSTRACT

One embodiment is directed to a system comprising a portable device executing a mobile application; and a rack controller without a display unit, the rack controller comprising a base unit. The base unit includes a processor configured to execute software that directs the processor to interact with the mobile application to show information and receive user input associated with the rack controller and at least one of rack and patching equipment installed in one or more racks even if there is not a display unit coupled to the (Continued)

base unit. In additional embodiments, a rack controller is configured to determine whether each rack controller interface is connected to another rack controller as a function of a respective sense signal developed by the termination circuit associated with said rack controller interface. Other embodiments are disclosed.

13 Claims, 5 Drawing Sheets

Related U.S. Application Data (60) Provisional application No. 62/515,496, filed on Jun. 5, 2017.

(56) References Cited

U.S. PATENT DOCUMENTS

| | | | |
|---|---|---|---|
| 6,784,802 | B1 | 8/2004 | Stanescu |
| 2002/0071394 | A1 | 6/2002 | Koziy et al. |
| 2002/0084994 | A1* | 7/2002 | Hansen .................. G06F 1/183 345/204 |
| 2002/0180590 | A1 | 12/2002 | Abrams |
| 2004/0267918 | A1* | 12/2004 | Guarraci ............ G06F 11/2294 714/E11.173 |
| 2006/0053324 | A1* | 3/2006 | Giat ........................ H04L 12/10 713/300 |
| 2008/0049627 | A1 | 2/2008 | Nordin |
| 2009/0112373 | A1 | 4/2009 | Feldman et al. |
| 2010/0008482 | A1 | 1/2010 | Tucker |
| 2010/0141379 | A1* | 6/2010 | Tucker .................. H04Q 1/114 361/679.02 |
| 2010/0233961 | A1 | 9/2010 | Holden et al. |
| 2012/0198246 | A1 | 8/2012 | German et al. |
| 2013/0149912 | A1* | 6/2013 | Oberski .................. H04L 41/04 439/676 |
| 2014/0111346 | A1* | 4/2014 | Pinn ........................ H04Q 1/09 340/691.6 |
| 2020/0097429 | A1 | 3/2020 | Kiener et al. |

FOREIGN PATENT DOCUMENTS

| | | |
|---|---|---|
| CN | 103404165 A | 11/2013 |
| CN | 103561358 A | 2/2014 |
| CN | 105720392 A | 6/2016 |
| JP | 2015167396 A | 9/2015 |
| WO | 2010005504 A2 | 1/2010 |

OTHER PUBLICATIONS

China National Intellectual Property Administration, "First Office Action", from CN Application No. 201880033540.6, from Foreign Counterpart to U.S. Appl. No. 16/619,076, May 26, 2021, pp. 1 through 20, Published: CN.

China National Intellectual Property Administration, "Notification of Second Office Action", from CN Application No. 201880033540. 6, from Foreign Counterpart to U.S. Appl. No. 16/619,076, Jan. 4, 2022, pp. 1 through 16, Published: CN.

European Patent Office, "Extended European Search Report", from EP Application No. 18813244.3, from Foreign Counterpart to U.S. Appl. No. 16/619,076, Feb. 4, 2021, pp. 1 through 8, Published: EP.

International Bureau, "International Preliminary Report on Patentability" from PCT Application No. PCT/US2018/036137, from Foreign Counterpart to U.S. Appl. No. 16/619,076, Dec. 19, 2019, pp. 1 through 12, Published in: WO.

International Searching Authority, "International Search Report and Written Opinion", from PCT Application No. PCT/US2018/036137, Sep. 20, 2018, pp. 1 through 16, Published: WO.

International Standard, "Information technology—Automated infrastructure management (AIM) systems—Requirements, data exchange and applications", ISO/IEC 18598, Edition 1.0, Sep. 2016, pp. 1 through 6, SO, International Electrotechnical Commission, ICS 35.200.

Japanese Patent Office, "Notice of Reasons for Rejection", from JP Application No. 2019-566889, from Foreign Counterpart to U.S. Appl. No. 16/619,076, Jul. 5, 2022, pp. 1 through 11, Published: JP.

Microchip, "Integrated 3-Port 10/100 Managed Switch with PHYs", KSZ8863MLL/FLL/RLL, (c) 2017 Microchip Technology Inc., pp. 1 through 92.

Micron, "Nand Flash Memory", Rev. Q, Apr. 2014, (c) 2009 Micron Technology, Inc., pp. 1 through 133.

State Intellectual Property Office, P.R. China, "Notice to Grant" from CN Application No. 201880033540.6, from Foreign Counterpart to U.S. Appl. No. 16/619,076, May 26, 2022, pp. 1 through 3, Published: CN.

Texas Instruments, "Pin Mux Utility for ARM MPU Processors", Apr. 2012, pp. 1 through 26, Texas Instruments Incorporated.

Texas Instruments, "Silicon Errata, AM335x Sitara Processors Silicon Revisions 2.1, 2.0 1.0", Revised Jan. 2017, pp. 1 through 44, Texas Instruments Incorporated.

Texas Instruments, "Technical Reference Manual, AM335x and AMIC110 Sitara Processors", Revised Mar. 2017, pp. 1 through 5113, Texas Instruments Incorporated.

Texas Instruments, "TPS65910Ax User's Guide for AM335x Processors", Revised Dec. 2017, pp. 1 through 10, Texas Instruments Incorporated.

Texas Instruments, "TPS65910x Integrated Power-Management Unit Top Specification", Revised Oct. 2014, pp. 1 through 107, Texas Instruments Incorporated.

U.S. Patent and Trademark Office, "Advisory Action", U.S. Appl. No. 16/619,076, Nov. 29, 2021, pp. 1 through 3, Published: US.

U.S. Patent and Trademark Office, "Advisory Action", U.S. Appl. No. 16/619,076, Aug. 5, 2022, pp. 1 through 3, Published: US.

U.S. Patent and Trademark Office, "Corrected Notice of Allowability", U.S. Appl. No. 16/619,076, Oct. 13, 2022, pp. 1 through 5, Published: US.

U.S. Patent and Trademark Office, "Final Office Action", U.S. Appl. No. 16/619,076, May 20, 2022, pp. 1 through 17, Published: US.

U.S. Patent and Trademark Office, "Final Office Action", U.S. Appl. No. 16/619,076, Sep. 14, 2021, pp. 1 through 22, Published: US.

U.S. Patent and Trademark Office, "Notice of Allowance", U.S. Appl. No. 16/619,076, Sep. 28, 2022, pp. 1 through 24, Published: US.

U.S. Patent and Trademark Office, "Office Action", U.S. Appl. No. 16/619,076, Jan. 24, 2022, pp. 1 through 13, Published: US.

U.S. Patent and Trademark Office, "Office Action", U.S. Appl. No. 16/619,076, May 28, 2021, pp. 1 through 23, Published: US.

European Patent Office, "Communication pursuant to Article 94(3)EPC", dated Oct. 21, 2024, from EP Application No. 18813244.3, from Foreign Counterpart to U.S. Appl. No. 16/619,076, pp. 1 through 6, Published: EP.

\* cited by examiner

RACK CONTROLLER WITH NATIVE SUPPORT FOR INTELLIGENT PATCHING EQUIPMENT INSTALLED IN MULTIPLE RACKS

CROSS-REFERENCE TO RELATED APPLICATIONS

This application is a divisional application of U.S. patent application Ser. No. 16/619,076, filed Dec. 3, 2019 and titled "RACK CONTROLLER WITH NATIVE SUPPORT FOR INTELLIGENT PATCHING EQUIPMENT INSTALLED IN MULTIPLE RACKS", which is a national stage application, filed under 35 U.S.C. Section 371, of International Patent Application No. PCT/US2018/036137, filed on Jun. 5, 2018, which claims the benefit of U.S. Provisional Patent Application Ser. No. 62/515,496, filed Jun. 5, 2017 and titled "RACK CONTROLLER WITH NATIVE SUPPORT FOR INTELLIGENT PATCHING EQUIPMENT INSTALLED IN MULTIPLE RACKS", the contents of all of which are incorporated herein by reference in their entireties.

BACKGROUND

Automated Infrastructure Management (AIM) systems are used to track connections that are made between ports (or other connection points) that exist in the information technology (IT) infrastructure of a data center. AIM systems are typically designed to work with patching equipment that has AIM-related functionality for tracking connections made at the ports of such patching equipment. Such "intelligent" patching equipment is typically mounted in racks. Each rack typically includes a rack controller that is communicatively coupled to the AIM-related functionality for each item of intelligent patching equipment mounted in that rack. The rack controller aggregates connection information for the ports of the patching equipment in the associated rack. Each rack controller also typically includes, or is coupled to, a display device for displaying information for a user located at the rack and a user-input device for receiving user-input from the user. In one example, the display device and the user-input device are implemented together in a liquid crystal display (LCD) with a touch screen that is used for both displaying information and receiving user input. This combination of a display device and user-input device is also referred to here as a "display unit."

The display unit is used by the rack controller to a display a user interface for software that executes on the associated rack controller. This rack controller software is used, for example, to display information for a user about connections made at the ports of patching equipment installed in the associated rack and to receive information from a user about connections made at the ports of such patching equipment. Such rack controller software, and the AIM system more generally, is typically designed to require the use of a display unit at the rack controller.

Typically, with such AIM systems, each rack controller is designed to be connected to only the patching equipment that is installed in the same rack in which the rack controller is installed. A single bus (also referred to here as a "patching equipment bus") is typically used to couple the rack controller to the intelligent patching equipment installed in the same rack.

US Patent Publication No. 20100141379 describes the use of "patching equipment bus extenders" that can be used in situations where a rack controller is installed in a first rack, and patching equipment bus extenders are mounted on adjacent racks so that intelligent patching equipment installed in those adjacent racks can be connected to the rack controller installed in the first rack. The patching equipment bus extenders are used to connect the patching equipment installed in the adjacent racks to the same bus used to connect the patching equipment installed in the first rack to the rack controller. However, as noted above, such rack controllers are typically designed to work with patching equipment installed in the same rack that the rack controller is installed in. That is, such "single-rack" rack controllers typically do not have the capacity to be connected to more than the number of items of patching equipment that would typically be installed in a single rack, even if patching equipment bus extenders are used to connect the rack controller to patching equipment installed in adjacent racks. In other words, patching equipment bus extenders are typically only useful in situations where the first rack in which the rack controller is installed is not fully populated with patching equipment, and there is only a small number of items of patching equipment installed in the adjacent racks.

Also, the software executing on such a single-rack rack controller is configured to assume that all intelligent patching equipment coupled to the patching equipment bus is installed in the same rack that the rack controller is installed in. That is, such rack controller software does not typically include functionality for dealing with patching equipment that is not located in the same rack as the rack controller.

For the purposes of an AIM system, multiple racks may be assigned to a "zone," where the respective rack controllers for each of the racks in a zone are connected together in a daisy chain with one rack controller (the head of the daisy chain) having an external connection to an ETHERNET local area network (LAN) and, ultimately, the AIM system manager.

To support the daisy chaining of rack controllers, each rack controller can include two RJ-45 jacks, one of which is connected to either an upstream rack controller or the external ETHERNET LAN and the other of which either is connected to a downstream rack controller, is connected to the external ETHERNET LAN, or is not connected to anything. Typically, the rack controller includes a respective manual switch for each such RJ-45 jack to indicate how the respective RJ-45 is configured (that is, in the case of the first RJ-45 jack, whether the first RJ-45 jack is connected to either an upstream rack controller or the ETHERNET LAN, or, in the case of the second RJ-45 jack, whether the second RJ-45 jack is either connected to a downstream rack controller, is connected to the external ETHERNET LAN, or is not connected to anything).

SUMMARY

One embodiment is directed to a multi-rack rack controller for use in an automated infrastructure management (AIM) system. The rack controller comprises a processor configured to execute software and a plurality of independent patching equipment bus interfaces. Each bus interface is configured to couple the processor to a respective patching equipment bus assembly installed in a respective one of multiple racks in which intelligent patching equipment is installed for communicating with and providing power to the intelligent patching equipment.

Another embodiment is directed to a rack controller for use in an automated infrastructure management (AIM) system. The rack controller comprises a processor configured to execute software and at least one patching equipment bus interface. Each patching equipment bus interface is configured to couple the processor to a respective patching equipment bus assembly installed in a respective rack in which intelligent patching equipment is installed for communicating with and providing power to the intelligent patching equipment. The rack controller further comprises at least one rack controller interface, each rack controller interface configured to connect the rack controller to another rack controller. Each rack controller interface comprises a respective termination circuit that is configured to develop a respective first predetermined level for a respective sense signal of said rack controller interface when said rack controller interface is connected to another rack controller and develop a respective second predetermined level for the respective sense signal of said rack controller interface when said rack controller interface is not connected to another rack controller. The processor is configured to determine whether each rack controller interface is connected to another rack controller as a function of the respective sense signal.

Another embodiment is directed to a rack controller for use in an automated infrastructure management (AIM) system. The rack controller comprises a base unit comprising a processor configured to execute software and at least one patching equipment bus interface. Each patching equipment bus interface is configured to couple the processor to a respective patching equipment bus assembly installed in a respective rack in which intelligent patching equipment is installed for communicating with and providing power to the intelligent patching equipment. The rack controller further comprises a locate button disposed on the front of the base unit, the locate button coupled to the processor. The locate button can be actuated in order to provide a user input to the processor even if there is not a display unit coupled to the base unit and to cause the rack controller to send a message operable to cause an app executing on a portable device to show information associated with at least one of the rack controller, the rack, or the patching equipment installed in the rack.

Other embodiments are disclosed.

The details of various embodiments are set forth in the accompanying drawings and the description below. Other features and advantages will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
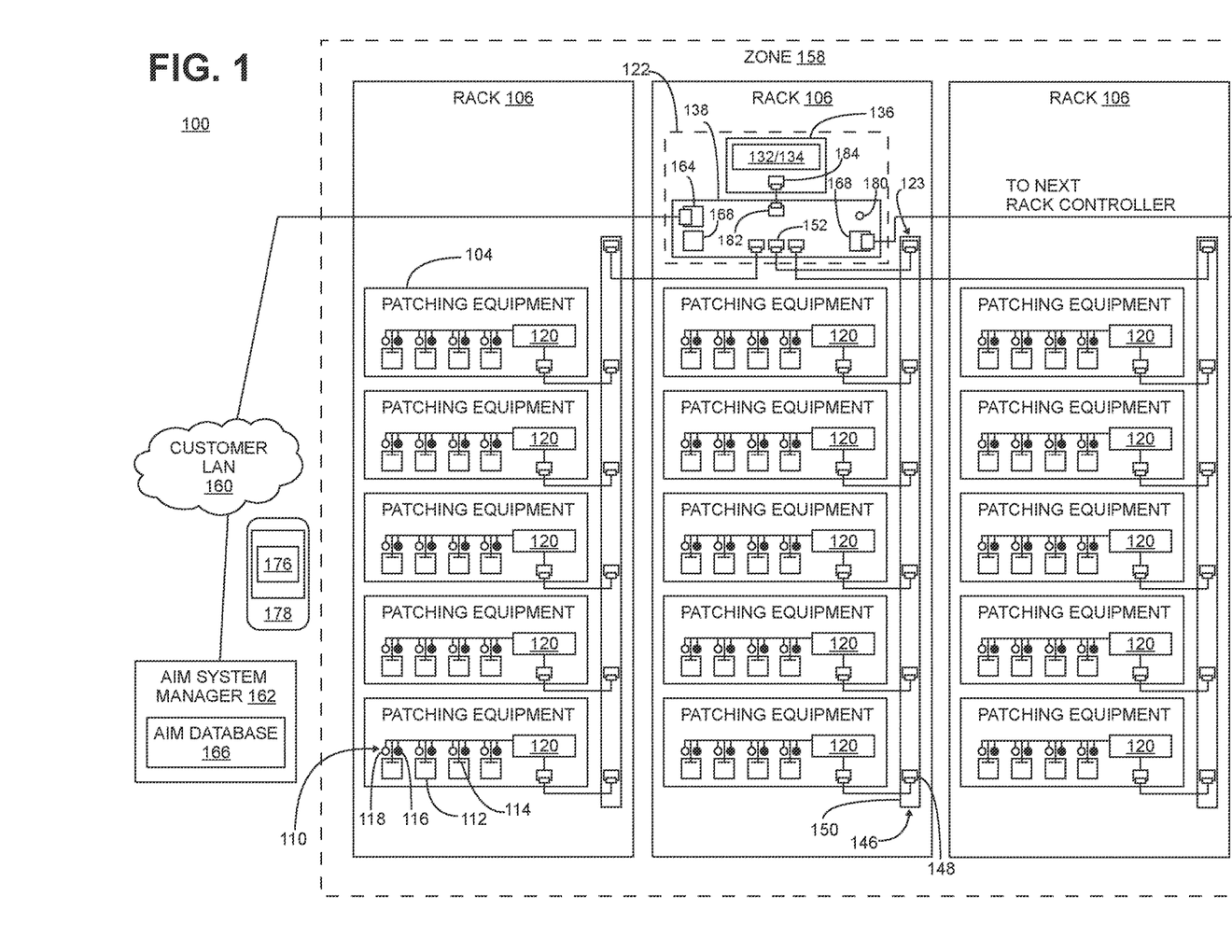
FIG. 1 illustrates one exemplary embodiment of an automated infrastructure management (AIM) system that is configured to track connections that are made using items of patching equipment.

FIG. 1 illustrates one exemplary embodiment of an automated infrastructure management (AIM) system 100 that is configured to track connections that are made using items of patching equipment 104. The connections can be made with various types of cabling, including, without limitation, copper cables and fiber optic cables.

The system 100 shown in FIG. 1 can be implemented in a data center or enterprise application. Other embodiments can be implemented in other ways (for example, where the system 100 is implemented in a central office or other facility of a telecommunication service provider and/or in another part of the telecommunication service provider's network).

The patching equipment 104 is deployed in racks 106 along with other items of equipment (not shown) (such as servers, routers, and switches).

In one aspect illustrated in FIG. 1, the AIM system 100 is configured to work with patching equipment 104 (such as patch panels) that has AIM functionality 110 for tracking connections at the ports 112 of the patching equipment 104. This patching equipment 104 is also referred to here as "intelligent patching equipment" 104. In one aspect, the AIM functionality 110 comprises, for each port 112 of the associated item of patching equipment 104, a sensor, reader, interface, or other circuitry (collectively referred to here as a "sensor") 114 for use in determining the presence of, and/or information from or about, a connector and/or cable attached to the associated port 112. In one aspect, the AIM functionality 110 comprises, for each port 112 of the associated item of intelligent patching equipment 104, one or more visual indicators 116 (such as one or more light emitting diodes (LEDs)) for providing a visual indication to a user, for example, to enable the user to visually identify that particular port 112. In one aspect, the AIM functionality 110 also comprises, for each port 112 of the associated item of intelligent patching equipment 104, a respective user-input device 118 (such as a button) by which a user is able to select that port 112.

Various types of AIM technology can be used. One type of AIM technology infers connection information by sensing when connectors are inserted or removed from ports of the various devices. Another type of AIM technology makes use of so-called "ninth wire" or "tenth wire" technology. Ninth wire/tenth wire technology makes use of special cables that include one or more extra conductors or signal paths that are used for determining which port each end of the cable is inserted into. Yet another type of AIM technology makes use of an Electrically Erasable Programmable Read-Only Memory (EEPROM) or other storage device that is integrated with or attached to a connector on a cable. The storage device is used to store an identifier for the cable or connector along with other information. The port (or other connector) into which the associated connector is inserted is configured to read the information stored in the EEPROM when the connector is inserted into the port of patch panel or other item of patching equipment. A similar approach can be used with optical machine-readable representations of data (such as barcodes or QR codes).

Another type of AIM technology makes use of radio frequency identification (RFID) tags and readers. With RFID technology, an RFID tag is attached to or integrated with a connector on a cable. The RFID tag is used to store an identifier for the cable or connector along with other information. The RFID tag is typically then read using an RFID reader after the associated connector is inserted into a port (or other connector) of a patch panel or other item of patching equipment.

Other types of AIM technology can be used.

In one aspect illustrated in FIG. 1, each item of intelligent patching equipment 104 includes a respective programmable processor 120 that is communicatively coupled to the other AIM functionality 110 in that item of patching equipment 104. The programmable processor 120 is configured to execute software that reads or otherwise receives information from each sensor 114, controls the state of each visual indicator 116, and determines the state of each button 118.

The sensor 114, visual indicator 116, button 118, and processor 120 can be natively integrated into the patching equipment 104 or can be packaged into a retrofit kit that can be installed on already deployed patching equipment 104.

The AIM system 100 further comprises one or more rack controllers 122.

Each rack controller 122 is configured to be connected to, and manage, patching equipment 104 having AIM functionality 110 that is installed in multiple racks 106. That is, each such rack controller 122 is a "multi-rack" rack controller 122.

In this exemplary embodiment, each multi-rack rack controller 122 is configured to be connected to patching equipment 104 that is installed in three racks 106, though it is to be understood that this is merely one example and that, in other embodiments, one or more multi-rack rack controllers 122 can be configured to be connected to patching equipment 104 installed in a different number of racks 106.

In this exemplary embodiment, each multi-rack rack controller 122 is configured to use three, separate and independent patching equipment buses 123 to communicate with intelligent patching equipment 104 installed in the three racks 106.

Each rack controller 122 aggregates connection information for the ports 112 of the patching equipment 104 in the associated racks 106. More specifically, each rack controller 122 is configured to use the sensor 114 associated with each port 112 of the patching equipment 104 mounted in the associated rack 106 to monitor the state of each port 112 and identify connection or disconnection events occurring at that port 112. Also, each rack controller 122 is configured to illuminate or otherwise actuate any visual indicators 116 associated with the port 112 and to monitor the state of each button 118 associated with that port 112 and identify any events occurring at such buttons 118 (for example, button press and/or release events).

Figure 2:
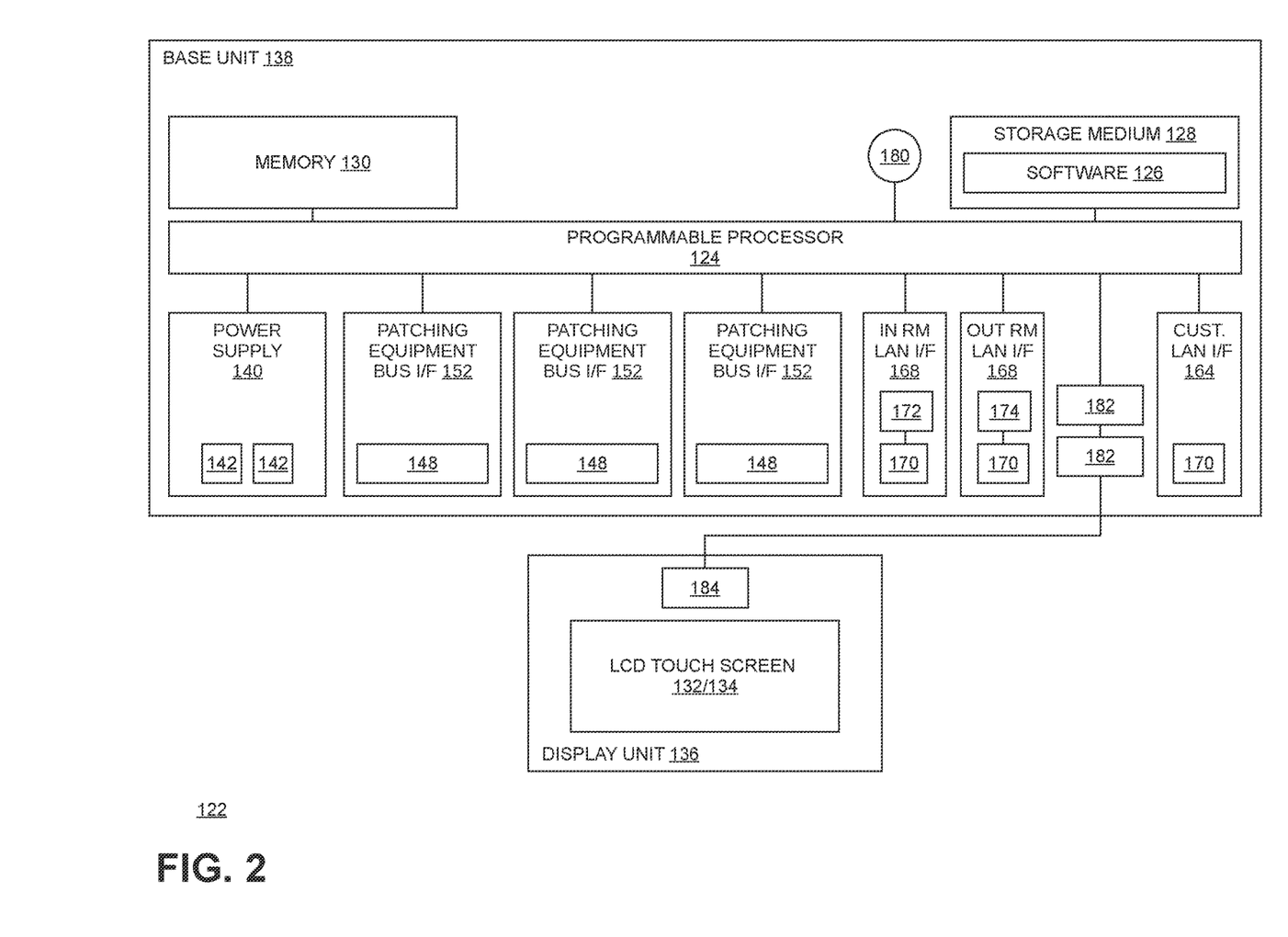
FIG. 2 is a block diagram illustrating one exemplary embodiment of a multi-rack rack controller.

One exemplary embodiment of a multi-rack rack controller 122 is shown in FIG. 2. In one aspect illustrated in FIG. 2, each rack controller 122 comprises at least one programmable processor 124 on which software or firmware 126 executes. The software 126 comprises program instructions that are stored (or otherwise embodied) on an appropriate non-transitory storage medium or media 128 from which at least a portion of the program instructions are read by the programmable processor 124 for execution thereby. The software 126 is configured to cause the processor 124 to carry out at least some of the operations described here as being performed by that rack controller 122. Although the storage medium 128 is shown in FIG. 2 as being included in the controller 122, it is to be understood that remote storage media (for example, storage media that is accessible over a network) and/or removable media can also be used. In one aspect illustrated in FIG. 2, each rack controller 122 also comprises memory 130 for storing the program instructions and any related data during execution of the software 126.

Each multi-rack rack controller 122 also includes a display device 132 for displaying information for a user located at the associated rack 106 and a user-input device 134 for receiving user-input from such a user. In one aspect illustrated in FIGS. 1 and 2, the display device 132 and the user-input device 134 are implemented together in a liquid crystal display (LCD) touch screen that is used for both displaying information and receiving user input. This combination of a display device 132 and user-input device 134 is also referred to here as a "display unit" 136. In this example embodiment, the multi-rack controller 122 is configured so that the display unit 136 can be moved relative to the rest of the multi-rack rack controller 122 (for example, the display unit 136 can be moved in and out, moved up and down, tilted, rotated, etc.). To facilitate this, the rest of the rack controller 122 is implemented in a base unit 138, where the display unit 136 is coupled to the base unit 138 for power, ground, and communications using, for example, a cable (for example a USB cable and USB interfaces 182 and 184). In this way, the display unit 136 can be moved relative to the base unit 138 to enable a user to more easily view and/or touch the display unit 136.

Each multi-rack controller 122 includes a power supply 140 that is configured to provide power for the base unit 136, the display unit 138, and the patching equipment 104 connected to the multi-rack rack controller 122. In this example, the power supply 140 includes two power connectors 142 so that two external power adapters (not shown) can be used to couple the power supply 140 in the rack controller 122 to two alternating current (AC) power sources. Two power connectors 142, power adapters, and power sources are used for power redundancy. Also, the power supply 140 and power adapters are configured and designed to have sufficient capacity to supply power to racks 106 that are fully populated with intelligent patching equipment 104.

As shown in FIG. 1, in this exemplary embodiment, each of the patching equipment buses 123 is implemented using a respective patching equipment bus assembly 146 that is mounted to one of the rails of the corresponding rack 106. The patching equipment bus assembly 146 comprises multiple patching equipment bus connectors 148 that are electrically coupled to one another via the bus 124. The patching equipment bus assembly 146 also comprises a housing 150 that encloses the conductors (or other circuitry or interconnects) that implement the bus 123 and that supports the bus connectors 148. The housing 150 is configured to be mounted to one of the rails of the rack 106 (for example, via an adhesive, one or more fasteners, or the like).

As noted above, in this exemplary embodiment, each multi-rack rack controller 122 is configured to use three, separate and independent patching equipment buses 123 to communicate with intelligent patching equipment 104 installed in three racks 106. To do this, each multi-rack rack controller 122 includes three patching equipment bus interfaces 152 to connect the rack controller 122 to the three patching equipment buses 123 and to provide power and ground to the patching equipment 104 installed in that rack 106 via the patching equipment bus 123 and to enable communications between the processor 124 in the rack controller 122 and the patching equipment 104 installed in the rack 106 via the patching equipment bus 123. Each patching equipment bus interface 152 comprises a respective patching equipment bus connector 154 (shown in FIG. 2) that can be used with an appropriate cable to connect that patching equipment bus connector 154 to a patching equipment bus connector 148 of a respective patching equipment bus assembly 146.

In this exemplary embodiment, each patching equipment bus 123 comprises a twenty-line bus, and, accordingly, each of the patching equipment bus connectors 148 and 154 comprises a twenty-pin connector. Sixteen of the twenty lines of each patching equipment bus 123 are used for an I2C bus to provide power, ground, and communications to the patching equipment 104. The other four lines of each patching equipment bus 123 are used to implement two RS-485 serial buses for programming and debugging purposes. However, it is to be understood, that this one example and that other embodiments can be implemented in other ways.

By using multiple, separate and independent patching equipment bus interfaces 152 along with a sufficiently powerful processor 124 and power supply 140, the multi-rack rack controller 122 is able to support more than a single rack's worth of patching equipment 104 in the multiple racks 106. This is in contrast to the approach described above in the Background that uses the patching equipment bus extenders described in US Patent Publication No. 20100141379 and a single-rack rack controller that typically only supports a single rack's worth of intelligent patching equipment.

The patching equipment bus connectors 154 of the multi-rack rack controller 122 can be connected to the patching equipment bus assemblies 146 installed in the various racks 106 in accordance with a predetermined scheme or policy. As a result, the software 126 executing on the processor 124 of the multi-rack rack controller 122 can use this predetermined scheme or policy to determine, for a given item of patching equipment 104 that the controller 122 is communicating with, which rack 106 that item is installed in.

In the exemplary embodiment shown in FIGS. 1 and 2, the multi-rack rack controller 122 includes three patching equipment bus connectors 154 that are arranged in row. A predetermined policy can be used that specifies that the multi-rack rack controller 122 be installed in the center rack 106. This policy can also specify that the patching equipment bus connector 154 on the left side of the row be used to connect the controller 122 to the patching equipment bus assembly 146 mounted in the leftmost rack 106, that the patching equipment bus connector 154 in the center of the row be used to connect the controller 122 to the patching equipment bus assembly 146 mounted in the center rack 106 (which is the rack 106 in which the rack controller 122 is installed), and that the patching equipment bus connector 154 on the right side of the row be used to connect the controller 122 to the patching equipment bus assembly 146 mounted in the rightmost rack 106.

Then, the software 126 executing on the processor 124 in the multi-rack rack controller 122 is able to determine, for a given item of patching equipment 104 that the controller 122 is communicating with, which rack 106 that item of patching equipment 104 is installed in by identifying which patching equipment bus interface 152 is being used to communicate with that item of patching equipment 104. This is in contrast to the approach described above in the Background that uses the patching equipment bus extenders described in US Patent Publication No. 20100141379, where the single-rack rack controller is not able to automatically determine which rack an item of patching equipment is installed in and instead assumes all items of patching equipment are installed in the same rack.

In the exemplary embodiment shown in FIG. 1, for the purposes of the AIM system 100, multiple racks 106 may be assigned to a zone 158, where the multi-rack rack controllers 122 for the racks 106 in a zone 158 are connected together in a daisy chain with one controller 122 (the head of the daisy chain) having an external connection to an external network 160 via which the controllers 122 are able to ultimately communicate with an AIM system manager 162.

In this example, the external network 160 is implemented as an ETHERNET local area network (LAN), which is also referred to as the "customer LAN."

In this embodiment, each multi-rack rack controller 122 comprises an external network interface 164 that can be used to directly connect that multi-rack rack controller 122 to the external network 160. As noted above, in this exemplary embodiment, the external network 160 is implemented as an ETHERNET LAN and, as a result, the external network interface 164 comprises an ETHERNET interface and is also referred to here as "ETHERNET interface" 164 or "customer LAN interface" 164.

The various rack controllers 122 provide asset and connection information to the AIM system manager 162. In one aspect, the AIM system manager 162 is configured to compile asset and connection information across all of the zones 158 and to provide an end-to-end trace of the connections made across those zones 158. The AIM system manager 162 stores the asset and connection information for the various zones 158 in an AIM database 166.

In this embodiment, each multi-rack rack controller 122 also comprises two rack controller interfaces 168 that can be used to connect each rack controller 122 to the other multi-rack rack controllers 122 in its zone 158 in a daisy-chain configuration. The rack controllers 122 for a given zone 158 that are daisy chained together form a rack controller (or rack manager) network, which is also referred to as a "rack manager LAN" or "RM LAN" and, as a result, the rack controller interfaces 168 are also referred to here as "RM LAN interfaces" 168.

Figure 3:
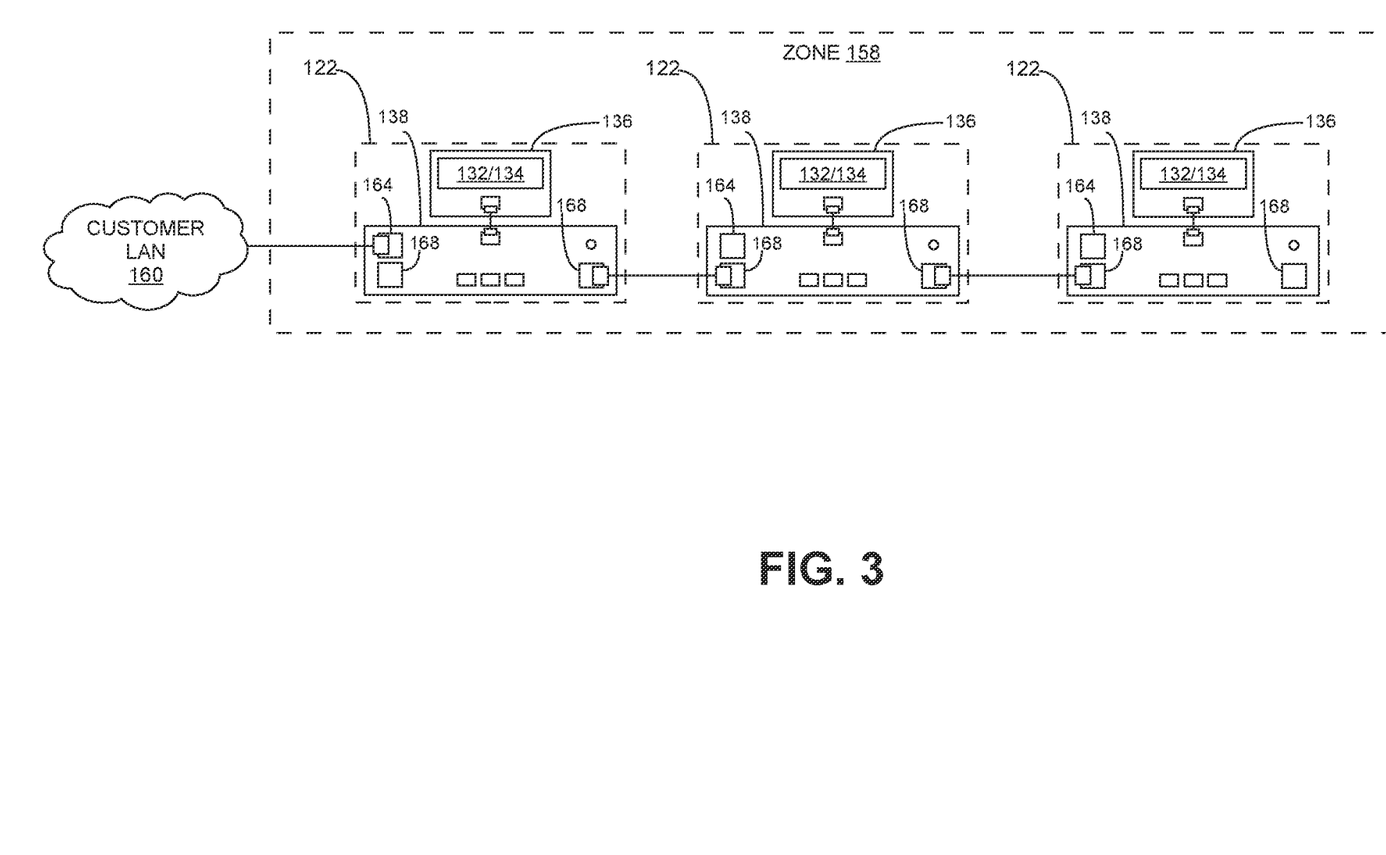
FIG. 3 is a block diagram illustrating one example of the daisy chaining of rack controllers to form a rack manager (RM) LAN.

In this example (as shown in FIG. 2), a first one of the RM LAN interfaces 168 is designated the "IN" RM LAN interface 168, while the other RM LAN interface 168 is designated the "OUT" RM LAN interface 168. The IN RM LAN interface 168 is used for connecting the associated rack controller 122 to either an upstream rack controller 122 in the RM LAN or to no rack controller 122. The OUT RM LAN interface 168 is used for connecting the associated rack controller 122 to either a downstream upstream rack controller 122 in the RM LAN or to no rack controller 122. One example of the daisy chaining of rack controllers 122 to form a RM LAN is shown in FIG. 3.

In this example, the RM LAN is implemented using 10/100BASE-T ETHERNET cabling terminated with RJ-45 plugs, and each RM LAN interface 168 comprises a respective RJ-45 jack 170 configured to be connected to a RJ-45 plug attached to an 10/100BASE-T ETHERNET cable. In this example, ETHERNET traffic communicated to and from the customer LAN 160 is forwarded as needed among the rack controllers 122 over the RM LAN. Also, in this example, one of the unused pairs in the 10/100BASE-T ETHERNET cabling is also used to implement a RS-485 bus over the RM LAN.

Each rack controller 122 (more specifically, the software 126 executing on the processor 124 in the controller 122) is configured to automatically determine the connectivity status of its RM LAN interfaces 168 and communicate over the RM LAN and customer LAN 160 accordingly. The IN and OUT RM LAN interface 168 comprises respective termination determination circuits 172 and 174. Each termination circuit 172 and 174 is configured to develop a signal that can be detected by the rack controller 122 to determine the connectivity status of its associated RM LAN interfaces 168.

Figure 4:
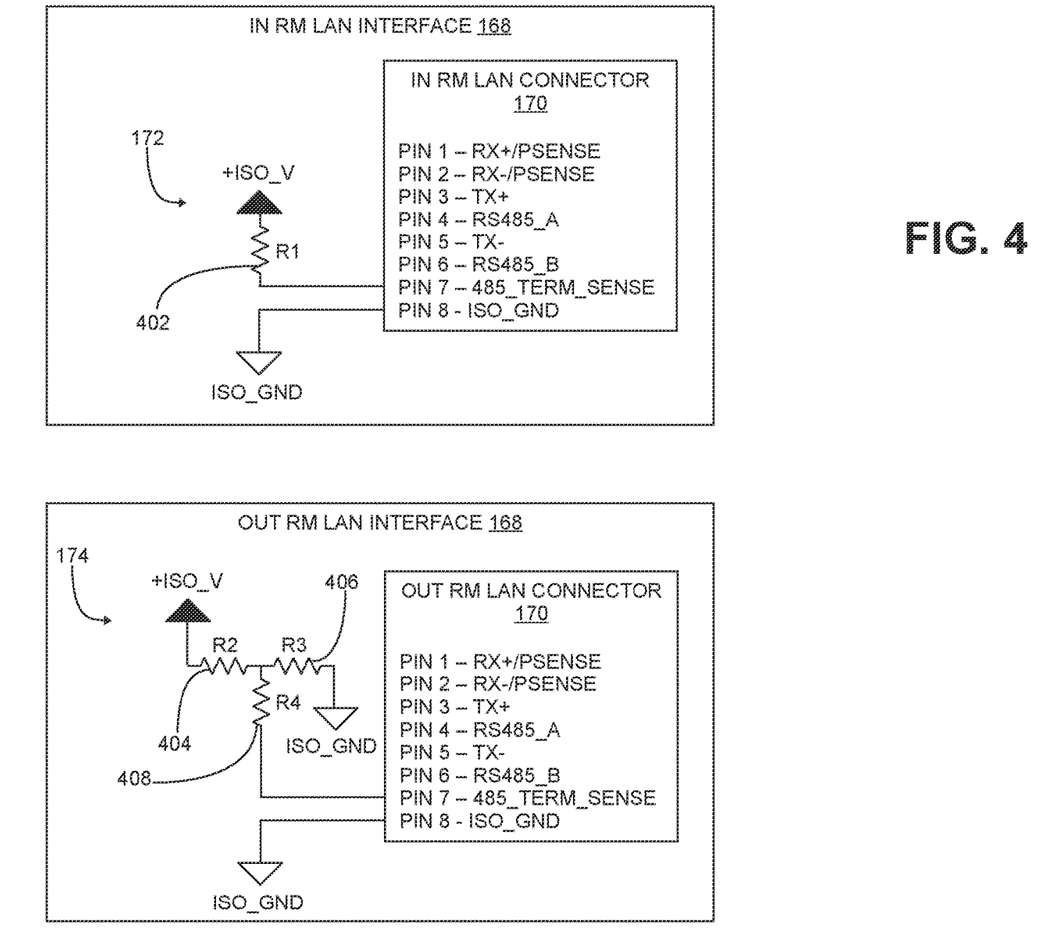
FIG. 4 is a block diagram illustrating exemplary embodiments of the termination circuits shown in FIG. 2.

FIG. 4 is a block diagram illustrating exemplary embodiments of the termination circuits 172 and 174 shown in FIG. 2. Termination circuit 172 is implemented as a part of the IN RM LAN interface 168, and termination circuit 174 is implemented as a part of the OUT RM LAN interface 168.

In this example, ETHERNET traffic is communicated over the 10/100BASE-T ETHERNET cabling in the standard way using the standard pairs (that is, using pair 2 (corresponding to pins 3 and 6) and pair 3 (corresponding to pins 1 and 2)). Also, one of the pairs in the 10/100BASE-T ETHERNET cabling not used for ETHERNET traffic is used for the RS-485 bus (in this example, pair 1 (corresponding to pins 4 and 5)), and another one of the pairs in the 10/100BASE-T ETHERNET cabling not used for ETHERNET traffic is used for developing a signal that can be detected by the rack controller 122 to determine the connectivity status of its associated RM LAN interfaces 168 (in this example, pair 4 (corresponding to pins 7 and 8)).

In this example, a signal (485_TERM_SENSE) is developed on pin 7 of the RJ-45 connector 170 of the IN RM LAN interface 168. The termination circuit 172 comprises a first resistor (R1) 402 that is coupled in series between a positive supply voltage rail (+ISO_V) and pin 7 of the RJ-45 connector 170 for the IN RM LAN interface 168. Pin 8 of the RJ-45 connector 170 of the IN RM LAN interface 168 is coupled to ground (ISO_GND). In this example, the first resistor R1 is implemented using a 10 kiloohm resistor.

In this example, a signal (485_TERM_SENSE) is developed on pin 7 of the RJ-45 connector 170 of the OUT RM LAN interface 168. The termination circuit 174 comprises a second resistor (R2) 404 and a third resistor (R3) 406 coupled in series between the positive supply voltage rail +ISO_V and ground ISO_GND. Pin 7 of the RJ-45 connector 170 of the OUT RM LAN interface 168 is coupled via a fourth resistor (R4) 408 to the junction between the second and third resistors R2 and R3. In this example, the second and fourth resistors R2 and R4 are implemented using 10 kiloohm resistors, and the third resistor R3 is implemented using a 4.5 kiloohm resistor.

When two rack controllers 122 are daisy chained together, the OUT RM LAN interface 168 of a first (upstream) rack controller 122 is connected to the IN RM LAN interface 168 of a second (downstream) rack controller 122 via a 10/100BASE-T ETHERNET cable. When this occurs, the terminations circuits 172 and 174 of the OUT and IN RM LAN interfaces 168 of the first and second rack controllers 122, respectively, are coupled to each other and the 485_TERM_SENSE signal on pin 7 of the RJ-45 connectors 170 of the OUT and IN RM LAN interfaces 168 will have a first predetermined level (3.27 Volts in this example).

When no 10/100BASE-T ETHERNET cable is connected to the OUT RM LAN interface 122 of a rack controller 122, the 485_TERM_SENSE signal on pin 7 of the RJ-45 connector 170 of the OUT RM LAN interface 168 will have a second predetermined level (1.55 Volts in this example).

When no 10/100BASE-T ETHERNET cable is connected to the IN RM LAN interface 122 of a rack controller 122, the 485_TERM_SENSE signal on pin 7 of the RJ-45 connector 170 of the IN RM LAN interface 168 will have a third predetermined level (5 Volts in this example).

By checking the level of the signal on the 485_TERM SENSE signal on pin 7 of the RJ-45 connectors 170 of the IN and OUT RM LAN interfaces 168, the software 126 executing on the processor 124 in a rack controller 122 is able to determine the connectivity status of its associated RM LAN interfaces 168.

In this example, when the software 126 executing on the processor 124 in a rack controller 122 detects the first predetermined level for the 485_TERMS_SENSE signal on pin 7 of the RJ-45 connector 170 of the IN RM LAN interface 168, the software 126 concludes that the IN RM LAN interface 168 is connected to the OUT RM LAN interface 168 of another rack controller 122. Likewise, in this example, when the software 126 executing on the processor 124 in a rack controller 122 detects the first predetermined level for the 485_TERMS_SENSE signal on pin 7 of the RJ-45 connector 170 of the OUT RM LAN interface 168, the software 126 concludes that the OUT RM LAN interface 168 is connected to the IN RM LAN interface 168 of another rack controller 122.

In this example, when the software 126 executing on the processor 124 in a rack controller 122 detects the second predetermined level for the 485_TERMS_SENSE signal on pin 7 of the RJ-45 connector 170 of the OUT RM LAN interface 168, the software 126 concludes that the OUT RM LAN interface 168 is not connected to another rack controller 122. In this example, when the software 126 executing on the processor 124 in a rack controller 122 detects the third predetermined level for the 485_TERMS_SENSE signal on pin 7 of the RJ-45 connector 170 of the IN RM LAN interface 168, the software 126 concludes that the IN RM LAN interface 168 is not connected to another rack controller 122. In this way, the software 126 is able to determine the connectivity status of its associated RM LAN interfaces 168. This approach does not make use of manual switches, which simplifies the process of installing such rack controllers 122.

Referring again to FIG. 1, the AIM system 100 further comprises an AIM application (or "app") 176 that is designed to be executed on a portable device 178 such as a smartphone or tablet (but can also be executed on other types of devices such as a desktop or laptop computer).

The AIM app 176 is configured to interact with the AIM system manager 162 and the rack controllers 122 (and the intelligent patching equipment 104 coupled to the rack controllers 122). The AIM app 176 is configured so that a user is able to carry out various functions that would otherwise be performed using the display unit 136 of each rack controller 122. By doing this, the rack controllers 122 can omit the display unit 136, thereby avoiding the cost associated with providing the display units 136 for the rack controllers 122.

To support configurations of the AIM system 100 where the rack controllers 122 are being used without display units 136, the base unit 138 of each rack controller 122 in this exemplary embodiment also comprises a locate button 180 on the front of the base unit 138. This locate button 180 is coupled to the processor 124 in the corresponding rack controller 122 so that the software 126 executing on the processor 124 is able to determine when the locate button 180 has been pressed and released. In this example, the base unit 138 includes one locate button 180 on the front of the base unit 138, but other numbers of locate buttons 180 can be used in other embodiments (for example, where there is a separate locate button 180 on the multi-rack rack controller 122 for each rack 106 used with that controller 122).

The locate button 180 can be used in various work-flows.

In this example, the rack controller 122 (and the software 126 executing thereon), the AIM system manager 162, and the AIM app 176 are configured to use the locate button 180 in the following way.

After the rack controller 122 has been installed and configured, when a user is performing a trace or patch at a rack 106 managed by that rack controller 122, a user can press the locate button 180 on the front of the rack controller 122 to cause the AIM app 176 to shift its focus to show information for the one or more racks 106 managed by that rack controller 122. Thereafter, when local operations are performed at those racks 106, the AIM app 176 will show information about the local operation and the relevant rack controller 122, rack 106, and/or patching equipment 104. Examples of such local operations include inserting patch cords into ports 112 of the patching equipment 104 in the associated racks 106, removing patch cords from ports 112 of the patching equipment 104 in the associated racks 106, and/or tracing a circuit connection by pressing a port button 118 associated with a port 112 of the patching equipment 104 in the associated racks 106.

The rack controller 122 causes the AIM app 176 to shift its focus to show such information by sending a message to the AIM system manager 162 in response to a user pressing the locate button 180. If the rack controller 122 where the locate button 180 was pressed is not directly connected to the customer LAN 160, the message is forwarded via the RM LAN for the associated zone 158 to the rack controller 122 that is directly connected to the customer LAN 160, which forwards the message to the AIM system manager 162 via the customer LAN 160. In response to receiving such a message, the AIM system manager 162 sends a message to the AIM app 176. Each of these messages includes location information identifying which rack controller's locate button 180 was pressed. In response to receiving this message, the AIM app 176 shifts its focus to show information about the rack controller 122 where the locate button 180 was pressed, the associated racks 106, and/or the associated patching equipment 104.

Without this, it may be difficult or inconvenient for the AIM app 176 to determine which rack's 106 local information to show. For example, a display unit 136 may need to be provided for each rack controller 122 or a user of the AIM app 176 may need to manually enter location information for the relevant rack 106 or rack controller 122 or may need to navigate in the user interface of the AIM app 176 (for example, by "drilling down" a tree-style user-interface element) to the rack 106 or rack controller 122. These approaches can be avoided by configuring the rack controller 122 (and the software 126 executing thereon), the AIM system manager 162, and the AIM app 176 to use the locate button 180 in as described above.

The locate button 180 can be used in other work-flows. For example, when the rack controller 122 is initially installed, the AIM app 176 executing on a user's portable device 178 can guide the user through a work flow for setting up and installing and configuring the rack controller 122, the patching equipment bus assemblies 146, and the intelligent patching equipment 104. However, when a rack controller 122 is first installed, coupled to the customer LAN 160, and powered on, that rack controller 122 may not have been previously discovered by the AIM system manager 162. When multiple rack controllers 122 are being installed at the same time, there is typically a need to provide an input for the rack controller 122 and/or AIM system manager 162 to identify or confirm on or for which rack controller 122 a particular operation in the installation and configuration work-flow is being performed.

Where a rack controller 122 has a display unit 136 connected to the base unit 138, the touch screen 134 of the display unit 136 can be used to provide such a confirmation input for the rack controller 122 and the AIM system manager 162.

However, where the rack controllers 122 are being used without display units 136, it is desirable to be able to provide such a confirmation input in another way. This can be done using the locate button 180 on the front of the base unit 138 of each rack controller 122. In this way other more cumbersome ways of identifying the rack controller 122 (for example, manually entering a serial number for the rack controller 122 into the AIM app 176) need not be used.

Figure 5:
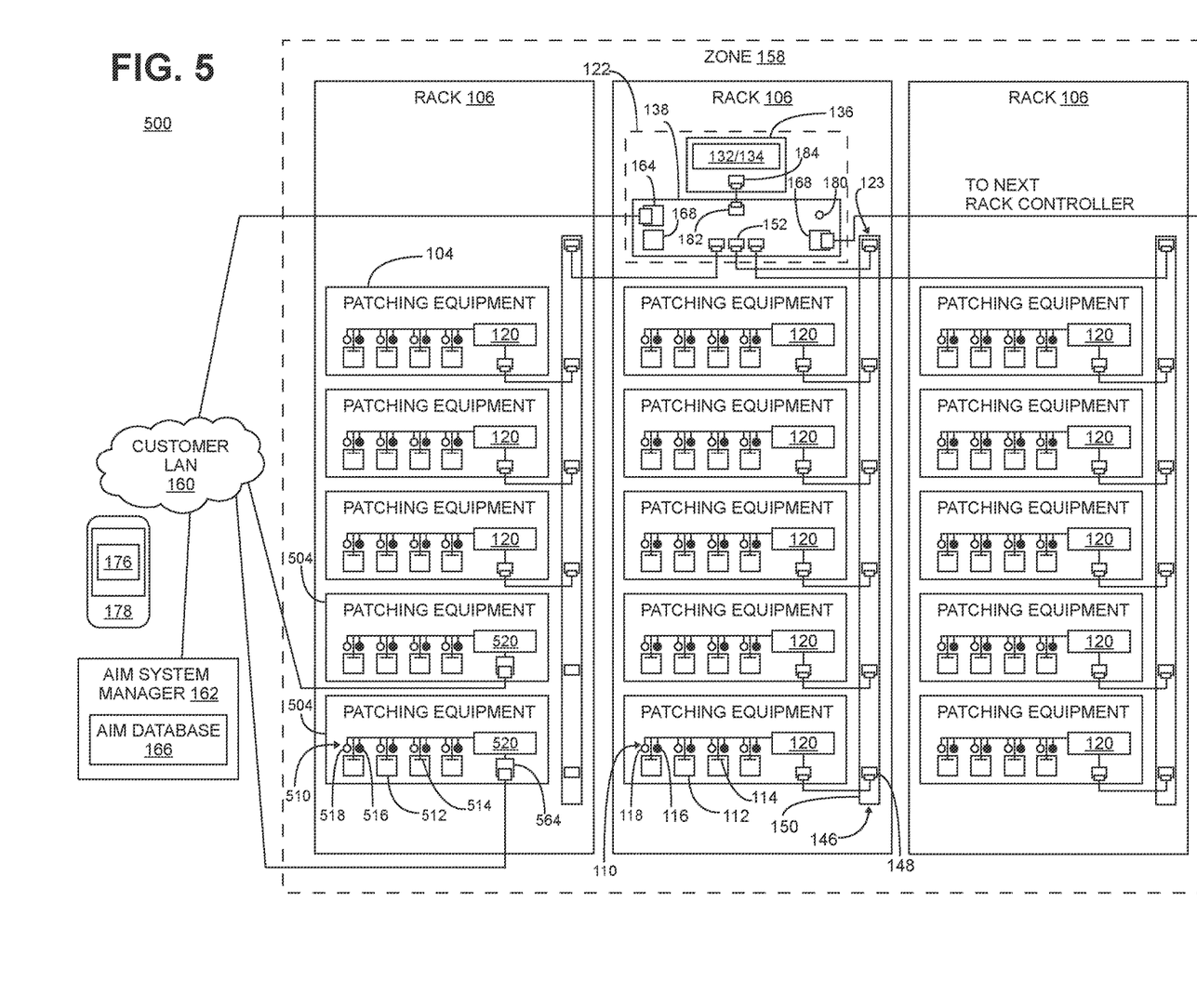
FIG. 5 illustrates an exemplary embodiment of an automated infrastructure management (AIM) system that is configured to track connections that are made using items of patching equipment that implement different types of AIM functionality.

FIG. 5 illustrates an exemplary embodiment of an automated infrastructure management (AIM) system 500 that is configured to track connections that are made using items of patching equipment 104 and 504 that implement different types of AIM functionality 110 and 510. The connections can be made with various types of cabling, including, without limitation, copper cables and fiber optic cables.

The system 500 is similar to the system 100 of FIG. 1 except as described below. Those elements of the AIM system 500 that are same as the corresponding elements of AIM system 100 are referenced in FIG. 5 using the same reference numerals, and the description of such elements is not repeated below in connection FIG. 5.

In the exemplary embodiment shown in FIG. 5, one set of intelligent patching equipment 104 implements AIM functionality 110 that requires the use of a rack controller 122 that is installed in a rack 106 and that is coupled to the patching equipment 104 via a patching equipment bus 123. In the exemplary embodiment shown in FIG. 5, a second set of intelligent patching equipment 504 implements AIM functionality 510 that does not require the use of a rack controller installed in a rack 106 and instead each item of patching equipment 504 includes a respective external network interface 564 to couple that item of patching equipment 504 directly to the external network 160. In this example, as with the example shown in FIG. 1, the external network 160 comprises an ETHERNET LAN and the external network interface 564 comprises an ETHERNET interface. In this way, each item of patching equipment 504 is able to interact with the AIM system manager 162 via the customer ETHERNET LAN 160.

In the exemplary embodiment shown in FIG. 5, although the second set of patching equipment 504 does not require the use of a rack controller 122 in order to function correctly, the rack controller 122 (more specifically, the software 126 executing on the processor 124 included in the rack controller 122) and the AIM system manager 162 are configured to display information and receive user input for the second set of patching equipment 504 using the rack controller 122, instead of or in addition to via the AIM app 176.

Information about the second set of patching equipment 504 is communicated between the patching equipment 504 and the system manager 162 directly via the customer LAN 162 (that is, without first passing through a rack controller 122). Information displayed on the display unit 136 of the rack controller 122 is communicated from the AIM system manager 162 to the rack controller 122. User input received via the display unit 136 of the rack controller 122 is communicated from the rack controller 122 to the AIM system manager 162 via the customer ETHERNET LAN 162. Any interactions with the second set of patching equipment 504 that need to be made in response to user input received via the rack controller 122 (for example, if a visual indicator 516 for a given port 512 needs to be illuminated), the AIM system manager 162 is able to perform those interactions directly with the relevant patching equipment 504. Likewise, information about connection events that a user makes at the ports 512 of the patching equipment 504 in response to information being displayed on the display unit 136 of the rack controller 122 are reported to the AIM system manager 162 directly from the relevant items of patching equipment 504.

With the AIM system 500, information can be displayed, and user input can be received, for a first type of intelligent patching equipment 504 using a rack controller 122 that was designed for use with a different type of intelligent patching equipment 104. This can be done in addition to or instead of using the AIM app 176. This is done using the AIM system manager 162 as the interface instead of using locally installed hardware to provide such an interface, which avoids the cost, space, and power associated with deploying such local hardware to serve as the interface.

The methods and techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

The foregoing description, including illustrated examples, has been presented only for the purpose of illustration and description and is not intended to be exhaustive or to limit the subject matter to the precise forms disclosed. Various modifications, adaptations, and uses thereof will be apparent to those skilled in the art without departing from this disclosure's scope. The illustrative examples described above are given to introduce the reader to the general subject matter discussed here and are not intended to limit the scope of the disclosed concepts.

EXAMPLE EMBODIMENTS

Example 1 includes a multi-rack rack controller for use in an automated infrastructure management (AIM) system, the rack controller comprising: a processor configured to execute software; a plurality of independent patching equipment bus interfaces, each bus interface configured to couple the processor to a respective patching equipment bus assembly installed in a respective one of multiple racks in which intelligent patching equipment is installed for communicating with and providing power to the intelligent patching equipment.

Example 2 includes the rack controller of Example 1, where the processor is configured to determine, for a given item of intelligent patching equipment that the rack controller is communicating with, which rack that given item is installed in based on which of the plurality of patching equipment bus interfaces is being used to communicate with that given item.

Example 3 includes the rack controller of Example 2, wherein the plurality of patching equipment bus interfaces is arranged to support a predetermined scheme specifying which of the plurality of patching equipment bus interfaces should be used to couple the intelligent patching equipment installed in each of the racks to the rack controller.

Example 4 includes the rack controller of any of the Examples 1-3, further comprising: an external network interface configured to couple the processor to an external network.

Example 5 includes the rack controller of Example 4, wherein the external network interface comprises an ETHERNET interface configured to couple the processor to an ETHERNET local area network (LAN).

Example 6 includes the rack controller of any of the Examples 1-5, further comprising: at least one rack controller interface, each rack controller interface configured to connect the rack controller to another rack controller.

Example 7 includes the rack controller of Example 6, wherein each rack controller interface comprises a respective termination circuit configured to: develop a respective first predetermined level for a respective sense signal of said rack controller interface when said rack controller interface is connected to another rack controller; and develop a respective second predetermined level for the respective sense signal of said rack controller interface when said rack controller interface is not connected to another rack controller; wherein the processor is configured to determine whether each rack controller interface is connected to another rack controller as a function of the respective sense signal.

Example 8 includes the rack controller of Example 7, wherein the at least one rack controller interface comprises first and second rack controller interfaces for establishing a network of rack controllers in a daisy chain topology.

Example 9 includes the rack controller of Example 8, wherein the respective first predetermined level of the first rack controller interface is not the same as the respective first predetermined level of the second rack controller interface.

Example 10 includes the rack controller of any of the Examples 7-9, wherein each rack controller comprises a respective RJ-45 jack configured to be connected to a RJ-45 plug attached to an ETHERNET cable.

Example 11 includes the rack controller of any of the Examples 1-10, further comprising a base unit that comprises the processor and the plurality of independent patching equipment bus interfaces.

Example 12 includes the rack controller of Example 11, wherein the base unit comprises a locate button disposed on the front of the base unit, the locate button coupled to the processor, wherein the locate button can be actuated in order to provide a user input to the processor and to cause the rack controller to send a message operable to cause an app executing on a portable device to show information associated with at least one of the rack controller, one or more of the racks, or the patching equipment installed in the one or more racks.

Example 13 includes the rack controller of any of the Examples 11-12, further comprising a display unit configured to be connected to the base unit via a cable.

Example 14 includes a rack controller for use in an automated infrastructure management (AIM) system, the rack controller comprising: a processor configured to execute software; at least one patching equipment bus interface, each patching equipment bus interface configured to couple the processor to a respective patching equipment bus assembly installed in a respective rack in which intelligent patching equipment is installed for communicating with and providing power to the intelligent patching equipment; and at least one rack controller interface, each rack controller interface configured to connect the rack controller to another rack controller; and wherein each rack controller interface comprises a respective termination circuit configured to: develop a respective first predetermined level for a respective sense signal of said rack controller interface when said rack controller interface is connected to another rack controller; and develop a respective second predetermined level for the respective sense signal of said rack controller interface when said rack controller interface is not connected to another rack controller; wherein the processor is configured to determine whether each rack controller interface is connected to another rack controller as a function of the respective sense signal.

Example 15 includes the rack controller of Example 14, wherein the at least one rack controller interface comprises first and second rack controller interfaces for establishing a network of rack controllers in a daisy chain topology.

Example 16 includes the rack controller of Example 15, wherein the respective first predetermined level of the first rack controller interface is not the same as the respective first predetermined level of the second rack controller interface.

Example 17 includes the rack controller of any of the Examples 14-16, wherein each rack controller comprises a respective RJ-45 jack configured to be connected to a RJ-45 plug attached to an ETHERNET cable.

Example 18 includes the rack controller of any of the Examples 14-17, further comprising: an external network interface configured to couple the processor to an external network.

Example 19 includes the rack controller of Example 18, wherein the external network interface comprises an ETHERNET interface configured to couple the processor to an ETHERNET local area network (LAN).

Example 20 includes the rack controller of any of the Examples 14-19, further comprising a base unit that comprises the processor and the patching equipment bus interface.

Example 21 includes the rack controller of Example 20, wherein the base unit comprises a locate button disposed on the front of the base unit, the locate button coupled to the processor, wherein the locate button can be actuated in order to provide a user input to the processor and to cause the rack controller to send a message operable to cause an app executing on a portable device to show information associated with at least one of the rack controller, the rack, or the patching equipment installed in the rack.

Example 22 includes the rack controller of any of the Examples 20-21, further comprising a display unit configured to be connected to the base unit via a cable.

Example 23 includes the rack controller of any of the Examples 14-22, wherein the at least one bus interface comprises a plurality of independent patching equipment bus interfaces, each patching equipment bus interface configured to couple the processor to a respective patching equipment bus assembly installed in a respective one of multiple racks in which intelligent patching equipment is installed for communicating with and providing power to the intelligent patching equipment.

Example 24 includes a rack controller for use in an automated infrastructure management (AIM) system, the rack controller comprising: a base unit comprising: a processor configured to execute software; at least one patching equipment bus interface, each patching equipment bus interface configured to couple the processor to a respective patching equipment bus assembly installed in a respective rack in which intelligent patching equipment is installed for communicating with and providing power to the intelligent patching equipment; and a locate button disposed on the front of the base unit, the locate button coupled to the processor, wherein the locate button can be actuated in order to provide a user input to the processor even if there is not a display unit coupled to the base unit and to cause the rack controller to send a message operable to cause an app executing on a portable device to show information associated with at least one of the rack controller, the rack, or the patching equipment installed in the rack.

Example 25 includes the rack controller of Example 24, further comprising a display unit configured to be connected to the base unit via a cable.

Example 26 includes the rack controller of any of the Examples 24-25, wherein the at least one bus interface comprises a plurality of independent patching equipment bus interfaces, each patching equipment bus interface configured to couple the processor to a respective patching equipment bus assembly installed in a respective one of multiple racks in which intelligent patching equipment is installed for communicating with and providing power to the intelligent patching equipment.

Example 27 includes the rack controller of any of the Examples 24-26, further comprising: an external network interface configured to couple the processor to an external network.

Example 28 includes the rack controller of Example 27, wherein the external network interface comprises an ETHERNET interface configured to couple the processor to an ETHERNET local area network (LAN).

Example 29 includes the rack controller of any of the Examples 24-28, further comprising: at least one rack controller interface, each rack controller interface configured to connect the rack controller to another rack controller.

Example 30 includes the rack controller of Example 29, wherein each rack controller interface comprises a respective termination circuit configured to: develop a respective first predetermined level for a respective sense signal of said rack controller interface when said rack controller interface is connected to another rack controller; and develop a respective second predetermined level for the respective sense signal of said rack controller interface when said rack controller interface is not connected to another rack controller; wherein the processor is configured to determine whether each rack controller interface is connected to another rack controller as a function of the respective sense signal.

Example 31 includes the rack controller of Example 30, wherein the at least one rack controller interface comprises first and second rack controller interfaces for establishing a network of rack controllers in a daisy chain topology.

Example 32 includes the rack controller of Example 31, wherein the respective first predetermined level of the first rack controller interface is not the same as the respective first predetermined level of the second rack controller interface.

Example 33 includes the rack controller of any of the Examples 29-32, wherein each rack controller comprises a respective RJ-45 jack configured to be connected to a RJ-45 plug attached to an ETHERNET cable.

The invention claimed is:

1. A system comprising:
a portable device executing a mobile application, the portable device having a display unit; and
a plurality of controllers without display units in communication with the portable device, each controller in the plurality of controllers comprising a base unit, the base unit comprising:
a processor configured to execute software that directs the processor to interact with the mobile application to cause the mobile application to focus on interacting with the base unit and show information and receive user input associated with the controller and at least one of rack and patching equipment installed in one or more racks in response to user input at the base unit, wherein the display unit of the portable device functions as a display for the plurality of controllers, wherein there is not a display unit positioned in the rack.

2. The system of claim 1, wherein the mobile application is configured to display the information related to the one or more racks managed by the controller in response to local operations performed by a user at the one or more racks.

3. The system of claim 2, wherein the local operations comprise at least one of:
inserting a patch cord into at least one port of the patching equipment;
removing patch cords from the at least one port of the patching equipment; and
tracing a circuit connection associated with the at least one port of the patching equipment.

4. The system of claim 1, wherein the mobile application is configured to receive connection information from a user about connections made at at least one port of the patching equipment.

5. The system of claim 1, the controller further comprising an external network interface configured to couple the processor to an external network.

6. The system of claim 1, wherein the base unit further comprises a plurality of patching equipment bus interfaces, each patching equipment bus interface configured to couple the processor to a respective patching equipment bus assembly installed in a respective rack in which the patching equipment having automated infrastructure management (AIM) functionality is installed for communicating with and providing power to the patching equipment.

7. The system of claim 1, further comprising: at least one controller interface, each controller interface configured to connect the controller to another controller, wherein each controller interface comprises a respective termination circuit configured to:
develop a respective first predetermined level for a respective sense signal of said controller interface when said controller interface is connected to another controller; and
develop a respective second predetermined level for the respective sense signal of said controller interface when said controller interface is not connected to another controller;
wherein the processor is configured to determine whether each controller interface is connected to another controller as a function of the respective sense signal.

8. The system of claim 7, wherein the at least one controller interface comprises first and second controller interfaces for establishing a network of controllers in a daisy chain topology, wherein the respective first predetermined level of the first controller interface is different from the respective first predetermined level of the second controller interface.

9. The system of claim 1, wherein the mobile application communicates with multiple controllers within a zone.

10. A controller comprising:
a portable device configured to execute a mobile application and act as a display unit, wherein the portable device acts as a display unit for multiple controllers;
a base unit, the base unit comprising:
a processor configured to execute software; and
at least one bus interface, each bus interface configured to couple the processor to a respective bus assembly installed in a respective rack;
wherein the processor sends messages to the portable device that cause the portable device to focus on interacting with the base unit and show information and receive user input associated with the controller in the multiple controllers and at least one of the rack and equipment installed in the rack in response to user input at the base unit, wherein the portable device functions as the display unit for the base unit and there is no display unit positioned in the rack.

11. The controller of claim 10, wherein the processor sends the messages to the portable device in response to local operations performed by a user at the rack, wherein the portable device executes a mobile application configured to display the information through a user interface in response to receiving the messages.

12. The controller of claim 11, wherein the local operations comprise at least one of:
inserting a patch cord into at least one port of the equipment;
removing patch cords from the at least one port of the equipment; and
tracing a circuit connection associated with the at least one port of the equipment.

13. The controller of claim 10, wherein the processor receives information about connections made at at least one port of the equipment from the portable device, wherein the portable device executes a mobile application configured to receive information through a user interface from a user about the connections.

* * * * *